(12) United States Patent
Kubista et al.

(10) Patent No.: US 7,647,886 B2
(45) Date of Patent: Jan. 19, 2010

(54) SYSTEMS FOR DEPOSITING MATERIAL ONTO WORKPIECES IN REACTION CHAMBERS AND METHODS FOR REMOVING BYPRODUCTS FROM REACTION CHAMBERS

(75) Inventors: David J. Kubista, Nampa, ID (US);
Trung T. Doan, Pflugerville, TX (US);
Lyle D. Breiner, Meridian, ID (US);
Ronald A. Weimer, Boise, ID (US);
Kevin L. Beaman, Boise, ID (US);
Er-Xuan Ping, Meridian, ID (US);
Lingyi A. Zheng, Boise, ID (US); Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1359 days.

(21) Appl. No.: 10/687,458

(22) Filed: Oct. 15, 2003

(65) Prior Publication Data
US 2005/0081786 A1    Apr. 21, 2005

(51) Int. Cl.
*C23C 16/455* (2006.01)
*C23C 16/52* (2006.01)
*C23F 1/00* (2006.01)
*H01L 21/306* (2006.01)
*C23C 16/06* (2006.01)
*C23C 16/22* (2006.01)

(52) U.S. Cl. ............... 118/666; 118/663; 118/689; 118/690; 118/692; 156/345.15

(58) Field of Classification Search ........ 118/666, 118/663, 689, 690, 692; 156/345.15
See application file for complete search history.

(56) References Cited

U.S. PATENT DOCUMENTS

| 579,269 A | 3/1897 | Hent |
| 3,618,919 A | 11/1971 | Beck |

(Continued)

FOREIGN PATENT DOCUMENTS

| DE | 198 51 824 A1 | 5/2000 |

(Continued)

OTHER PUBLICATIONS

U.S. Appl. No. 10/767,298, filed Jan. 28, 2004, Zheng et al.

(Continued)

*Primary Examiner*—Rudy Zervigon
(74) *Attorney, Agent, or Firm*—Perkins Coie LLP

(57) ABSTRACT

Systems for depositing material onto workpieces in reaction chambers and methods for removing byproducts from reaction chambers are disclosed herein. In one embodiment, the system includes a gas phase reaction chamber, a first exhaust line coupled to the reaction chamber, first and second traps each in fluid communication with the first exhaust line, and a vacuum pump coupled to the first exhaust line to remove gases from the reaction chamber. The first and second traps are operable independently to individually and/or jointly collect byproducts from the reaction chamber. It is emphasized that this Abstract is provided to comply with the rules requiring an abstract. It is submitted with the understanding that it will not be used to interpret or limit the scope or meaning of the claims.

8 Claims, 4 Drawing Sheets

U.S. PATENT DOCUMENTS

| | | | |
|---|---|---|---|
| 3,620,934 A | 11/1971 | Endle | |
| 3,630,769 A | 12/1971 | Hart et al. | |
| 3,630,881 A | 12/1971 | Lester et al. | |
| 3,634,212 A | 1/1972 | Valayll et al. | |
| 4,018,949 A | 4/1977 | Donokowski et al. | |
| 4,242,182 A | 12/1980 | Popescu | |
| 4,269,625 A | 5/1981 | Molenaar | |
| 4,289,061 A | 9/1981 | Emmett | |
| 4,313,783 A * | 2/1982 | Davies et al. | 438/716 |
| 4,397,753 A | 8/1983 | Czaja | |
| 4,438,724 A | 3/1984 | Doehler et al. | |
| 4,469,801 A | 9/1984 | Hirai et al. | |
| 4,545,136 A | 10/1985 | Izu et al. | |
| 4,590,042 A | 5/1986 | Drage | |
| 4,681,777 A | 7/1987 | Engelken et al. | |
| 4,826,579 A | 5/1989 | Westfall | |
| 4,948,979 A | 8/1990 | Munakata et al. | |
| 4,949,669 A | 8/1990 | Ishii et al. | |
| 4,966,646 A | 10/1990 | Zdeblick | |
| 4,977,106 A | 12/1990 | Smith | |
| 5,076,205 A | 12/1991 | Vowles et al. | |
| 5,091,207 A | 2/1992 | Tanaka | |
| 5,131,752 A | 7/1992 | Yu et al. | |
| 5,136,975 A | 8/1992 | Bartholomew et al. | |
| 5,172,849 A | 12/1992 | Barten et al. | |
| 5,200,023 A | 4/1993 | Gifford et al. | |
| 5,223,113 A | 6/1993 | Kaneko et al. | |
| 5,232,749 A | 8/1993 | Gilton | |
| 5,248,527 A | 9/1993 | Uchida et al. | |
| 5,364,219 A | 11/1994 | Takahashi et al. | |
| 5,377,429 A | 1/1995 | Sandhu et al. | |
| 5,380,396 A | 1/1995 | Shikida et al. | |
| 5,409,129 A | 4/1995 | Tsukada et al. | |
| 5,418,180 A | 5/1995 | Brown | |
| 5,427,666 A | 6/1995 | Mueller et al. | |
| 5,433,835 A | 7/1995 | Demaray et al. | |
| 5,445,491 A | 8/1995 | Nakagawa et al. | |
| 5,480,818 A | 1/1996 | Matsumoto et al. | |
| 5,498,292 A | 3/1996 | Ozaki | |
| 5,500,256 A | 3/1996 | Watabe | |
| 5,522,934 A | 6/1996 | Suzuki et al. | |
| 5,536,317 A | 7/1996 | Crain et al. | |
| 5,562,800 A | 10/1996 | Kawamura | |
| 5,589,002 A | 12/1996 | Su | |
| 5,592,581 A | 1/1997 | Okase | |
| 5,595,606 A | 1/1997 | Fujikawa et al. | |
| 5,599,513 A | 2/1997 | Masaki et al. | |
| 5,624,498 A | 4/1997 | Lee et al. | |
| 5,626,936 A | 5/1997 | Alderman | |
| 5,640,751 A | 6/1997 | Faria | |
| 5,643,394 A | 7/1997 | Maydan et al. | |
| 5,654,589 A | 8/1997 | Huang et al. | |
| 5,693,288 A | 12/1997 | Nakamura | |
| 5,729,896 A | 3/1998 | Dalal et al. | |
| 5,746,434 A | 5/1998 | Boyd et al. | |
| 5,766,364 A | 6/1998 | Ishida et al. | |
| 5,769,950 A * | 6/1998 | Takasu et al. | 118/715 |
| 5,769,952 A | 6/1998 | Komino | |
| 5,788,778 A | 8/1998 | Shang et al. | |
| 5,792,269 A | 8/1998 | Deacon et al. | |
| 5,792,700 A | 8/1998 | Turner et al. | |
| 5,819,683 A * | 10/1998 | Ikeda et al. | 118/724 |
| 5,820,641 A | 10/1998 | Gu et al. | |
| 5,827,370 A | 10/1998 | Gu | |
| 5,833,888 A | 11/1998 | Arya et al. | |
| 5,846,275 A | 12/1998 | Lane et al. | |
| 5,846,330 A | 12/1998 | Quirk et al. | |
| 5,851,849 A | 12/1998 | Comizzoli et al. | |
| 5,865,417 A | 2/1999 | Harris et al. | |
| 5,879,459 A | 3/1999 | Gadgil et al. | |
| 5,895,530 A | 4/1999 | Shrotriya et al. | |
| 5,902,403 A * | 5/1999 | Aitani et al. | 118/715 |
| 5,908,947 A | 6/1999 | Vaartstra | |
| 5,932,286 A | 8/1999 | Beinglass et al. | |
| 5,953,634 A | 9/1999 | Kajita et al. | |
| 5,956,613 A | 9/1999 | Zhao et al. | |
| 5,968,587 A | 10/1999 | Frankel | |
| 5,972,430 A | 10/1999 | DiMeo, Jr. et al. | |
| 5,994,181 A | 11/1999 | Hsieh et al. | |
| 5,997,588 A | 12/1999 | Goodwin et al. | |
| 6,008,086 A | 12/1999 | Schuegraf et al. | |
| 6,022,483 A * | 2/2000 | Aral | 216/59 |
| 6,032,923 A | 3/2000 | Biegelsen et al. | |
| 6,042,652 A | 3/2000 | Hyun et al. | |
| 6,045,620 A | 4/2000 | Tepman et al. | |
| 6,059,885 A | 5/2000 | Ohashi et al. | |
| 6,062,256 A | 5/2000 | Miller et al. | |
| 6,070,551 A | 6/2000 | Li et al. | |
| 6,079,426 A | 6/2000 | Subrahmanyam et al. | |
| 6,080,446 A | 6/2000 | Tobe et al. | |
| 6,086,677 A | 7/2000 | Umotoy et al. | |
| 6,089,543 A | 7/2000 | Freerks | |
| 6,109,206 A | 8/2000 | Maydan et al. | |
| 6,113,698 A * | 9/2000 | Raaijmakers et al. | 118/715 |
| 6,123,107 A | 9/2000 | Selser et al. | |
| 6,129,331 A | 10/2000 | Henning et al. | |
| 6,139,700 A | 10/2000 | Kang et al. | |
| 6,143,077 A | 11/2000 | Ikeda et al. | |
| 6,143,078 A | 11/2000 | Ishikawa et al. | |
| 6,143,659 A | 11/2000 | Leem | |
| 6,144,060 A | 11/2000 | Park et al. | |
| 6,149,123 A | 11/2000 | Harris et al. | |
| 6,159,298 A * | 12/2000 | Saito | 118/715 |
| 6,160,243 A | 12/2000 | Cozad | |
| 6,161,500 A | 12/2000 | Kopacz et al. | |
| 6,173,673 B1 | 1/2001 | Golovato et al. | |
| 6,174,366 B1 | 1/2001 | Ihantola | |
| 6,174,377 B1 | 1/2001 | Doering et al. | |
| 6,174,809 B1 | 1/2001 | Kang et al. | |
| 6,178,660 B1 | 1/2001 | Emmi et al. | |
| 6,182,603 B1 | 2/2001 | Shang et al. | |
| 6,192,827 B1 | 2/2001 | Welch et al. | |
| 6,193,802 B1 | 2/2001 | Pang et al. | |
| 6,194,628 B1 | 2/2001 | Pang et al. | |
| 6,197,119 B1 | 3/2001 | Dozoretz et al. | |
| 6,200,415 B1 | 3/2001 | Maraschin | |
| 6,203,613 B1 | 3/2001 | Gates et al. | |
| 6,206,972 B1 | 3/2001 | Dunham | |
| 6,210,754 B1 | 4/2001 | Lu et al. | |
| 6,211,033 B1 | 4/2001 | Sandhu et al. | |
| 6,211,078 B1 | 4/2001 | Matthews | |
| 6,214,714 B1 | 4/2001 | Wang et al. | |
| 6,237,394 B1 | 5/2001 | Harris et al. | |
| 6,237,529 B1 | 5/2001 | Spahn | |
| 6,245,192 B1 | 6/2001 | Dhindsa et al. | |
| 6,255,222 B1 | 7/2001 | Xia et al. | |
| 6,263,829 B1 | 7/2001 | Schneider et al. | |
| 6,270,572 B1 | 8/2001 | Kim et al. | |
| 6,277,763 B1 * | 8/2001 | Kugimiya et al. | 438/720 |
| 6,280,584 B1 | 8/2001 | Kumar et al. | |
| 6,287,965 B1 | 9/2001 | Kang et al. | |
| 6,287,980 B1 | 9/2001 | Hanazaki et al. | |
| 6,290,491 B1 | 9/2001 | Shahvandi et al. | |
| 6,291,337 B1 | 9/2001 | Sidhwa | |
| 6,297,539 B1 | 10/2001 | Ma et al. | |
| 6,302,964 B1 | 10/2001 | Umotoy et al. | |
| 6,302,965 B1 | 10/2001 | Umotoy et al. | |
| 6,303,953 B1 | 10/2001 | Doan et al. | |
| 6,305,314 B1 | 10/2001 | Sneh et al. | |
| 6,309,161 B1 | 10/2001 | Hofmeister | |
| 6,315,859 B1 | 11/2001 | Donohoe | |
| 6,328,803 B2 * | 12/2001 | Rolfson et al. | 118/715 |
| 6,329,297 B1 | 12/2001 | Balish et al. | |
| 6,334,928 B1 * | 1/2002 | Sekine et al. | 156/345.29 |

| | | |
|---|---|---|
| 6,342,277 B1 | 1/2002 | Sherman |
| 6,346,477 B1 | 2/2002 | Kaloyeros et al. |
| 6,347,602 B2 | 2/2002 | Goto et al. |
| 6,347,918 B1 | 2/2002 | Blahnik |
| 6,355,561 B1 | 3/2002 | Sandhu et al. |
| 6,358,323 B1 | 3/2002 | Schmitt et al. |
| 6,374,831 B1 | 4/2002 | Chandran et al. |
| 6,383,300 B1 * | 5/2002 | Saito et al. ............. 118/715 |
| 6,387,185 B2 | 5/2002 | Doering et al. |
| 6,387,207 B1 | 5/2002 | Janakiraman et al. |
| 6,402,806 B1 * | 6/2002 | Schmitt et al. ............. 75/414 |
| 6,419,462 B1 | 7/2002 | Horie et al. |
| 6,420,230 B1 | 7/2002 | Derderian et al. |
| 6,420,742 B1 | 7/2002 | Ahn et al. |
| 6,428,859 B1 | 8/2002 | Chiang et al. |
| 6,432,256 B1 | 8/2002 | Raoux |
| 6,432,259 B1 | 8/2002 | Noorbakhsh et al. |
| 6,432,831 B2 | 8/2002 | Dhindsa et al. |
| 6,435,865 B1 | 8/2002 | Tseng et al. |
| 6,444,039 B1 | 9/2002 | Nguyen |
| 6,450,117 B1 | 9/2002 | Murugesh et al. |
| 6,451,119 B2 | 9/2002 | Sneh et al. |
| 6,458,416 B1 | 10/2002 | Derderian et al. |
| 6,461,436 B1 | 10/2002 | Campbell et al. |
| 6,461,931 B1 | 10/2002 | Eldridge |
| 6,503,330 B1 | 1/2003 | Sneh et al. |
| 6,506,254 B1 | 1/2003 | Bosch et al. |
| 6,509,280 B2 | 1/2003 | Choi |
| 6,534,007 B1 | 3/2003 | Blonigan et al. |
| 6,534,395 B2 | 3/2003 | Werkhoven et al. |
| 6,540,838 B2 | 4/2003 | Sneh et al. |
| 6,541,353 B1 | 4/2003 | Sandhu et al. |
| 6,551,929 B1 | 4/2003 | Kori et al. |
| 6,562,140 B1 | 5/2003 | Bondestam et al. |
| 6,562,141 B2 | 5/2003 | Clarke |
| 6,573,184 B2 | 6/2003 | Park |
| 6,579,372 B2 | 6/2003 | Park |
| 6,579,374 B2 | 6/2003 | Bondestam et al. |
| 6,596,085 B1 | 7/2003 | Schmitt et al. |
| 6,602,346 B1 | 8/2003 | Gochberg |
| 6,630,201 B2 | 10/2003 | Chiang et al. |
| 6,635,965 B1 | 10/2003 | Lee et al. |
| 6,638,672 B2 | 10/2003 | Deguchi |
| 6,638,879 B2 | 10/2003 | Hsieh et al. |
| 6,641,673 B2 | 11/2003 | Yang |
| 6,663,713 B1 * | 12/2003 | Robles et al. ............. 118/719 |
| 6,673,196 B1 | 1/2004 | Oyabu |
| 6,704,913 B2 | 3/2004 | Rossman |
| 6,705,345 B1 | 3/2004 | Bifano |
| 6,706,334 B1 | 3/2004 | Kobayashi et al. |
| 6,770,145 B2 * | 8/2004 | Saito ............. 118/726 |
| 6,807,971 B2 * | 10/2004 | Saito et al. ............. 134/22.11 |
| 6,818,249 B2 | 11/2004 | Derderian |
| 6,821,347 B2 | 11/2004 | Carpenter et al. |
| 6,838,114 B2 | 1/2005 | Carpenter et al. |
| 6,861,094 B2 | 3/2005 | Derderian et al. |
| 2001/0010309 A1 | 8/2001 | Van Bilsen |
| 2001/0011526 A1 | 8/2001 | Doering et al. |
| 2001/0012697 A1 * | 8/2001 | Mikata ............. 438/758 |
| 2001/0024387 A1 | 9/2001 | Raaijmakers et al. |
| 2001/0029892 A1 | 10/2001 | Cook et al. |
| 2001/0045187 A1 | 11/2001 | Uhlenbrock |
| 2001/0054484 A1 | 12/2001 | Komino |
| 2002/0007790 A1 | 1/2002 | Park |
| 2002/0020353 A1 | 2/2002 | Redemann et al. |
| 2002/0043216 A1 | 4/2002 | Hwang et al. |
| 2002/0052097 A1 | 5/2002 | Park |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0110991 A1 | 8/2002 | Li |
| 2002/0127745 A1 | 9/2002 | Lu et al. |
| 2002/0129768 A1 | 9/2002 | Carpernter et al. |
| 2002/0144655 A1 | 10/2002 | Chiang et al. |
| 2002/0146512 A1 | 10/2002 | Rossman |
| 2002/0162506 A1 | 11/2002 | Sneh et al. |
| 2002/0164420 A1 | 11/2002 | Derderian et al. |
| 2002/0185067 A1 | 12/2002 | Upham |
| 2002/0195056 A1 | 12/2002 | Sandhu et al. |
| 2002/0195201 A1 | 12/2002 | Beer |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0013320 A1 | 1/2003 | Kim et al. |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0027431 A1 | 2/2003 | Sneh et al. |
| 2003/0037729 A1 | 2/2003 | DeDontney et al. |
| 2003/0037730 A1 * | 2/2003 | Yamasaki et al. ............. 118/715 |
| 2003/0060030 A1 | 3/2003 | Lee et al. |
| 2003/0066483 A1 | 4/2003 | Lee et al. |
| 2003/0070609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |
| 2003/0159780 A1 | 8/2003 | Carpenter et al. |
| 2003/0192645 A1 | 10/2003 | Liu |
| 2003/0194862 A1 | 10/2003 | Mardian et al. |
| 2003/0200926 A1 | 10/2003 | Dando et al. |
| 2003/0203109 A1 | 10/2003 | Dando et al. |
| 2004/0003777 A1 | 1/2004 | Carpernter et al. |
| 2004/0007188 A1 | 1/2004 | Burkhart et al. |
| 2004/0035358 A1 | 2/2004 | Basceri et al. |
| 2004/0040502 A1 | 3/2004 | Basceri et al. |
| 2004/0040503 A1 | 3/2004 | Basceri et al. |
| 2004/0083959 A1 | 5/2004 | Carpernter et al. |
| 2004/0083960 A1 | 5/2004 | Dando |
| 2004/0083961 A1 | 5/2004 | Basceri |
| 2004/0099377 A1 | 5/2004 | Newton et al. |
| 2004/0124131 A1 | 7/2004 | Aitchison et al. |
| 2004/0154538 A1 | 8/2004 | Carpenter et al. |
| 2004/0226507 A1 | 11/2004 | Carpenter et al. |
| 2004/0238123 A1 * | 12/2004 | Becknell et al. ............. 156/345.33 |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1 | 3/2005 | Zheng et al. |
| 2005/0059261 A1 | 3/2005 | Basceri et al. |
| 2005/0061243 A1 | 3/2005 | Sarigiannis et al. |

FOREIGN PATENT DOCUMENTS

| | | |
|---|---|---|
| EP | 1 167 569 A1 | 1/2002 |
| JP | 63-256460 A | 10/1988 |
| JP | 1-273991 A | 11/1989 |
| JP | 4-100533 A | 4/1992 |
| JP | 4-213818 A | 8/1992 |
| JP | 6-151558 A | 5/1994 |
| JP | 6-342785 A | 12/1994 |
| JP | 8-34678 A | 2/1996 |
| JP | 9-82650 A | 3/1997 |

| | | |
|---|---|---|
| JP | 10-223719 A | 8/1998 |
| JP | 11-172438 A | 6/1999 |
| JP | 2001-82682 A | 3/2001 |
| JP | 2001-261375 A | 9/2001 |
| JP | 2002-164336 A | 6/2002 |
| JP | 2001-254181 A | 9/2002 |
| SU | 598630 | 3/1978 |
| WO | WO-98/37258 A1 | 8/1998 |
| WO | WO-99/06610 A1 | 2/1999 |
| WO | WO-00/40772 A1 | 7/2000 |
| WO | WO-00/63952 A1 | 10/2000 |
| WO | WO-00/65649 A1 | 11/2000 |
| WO | WO-00/79019 A1 | 12/2000 |
| WO | WO-01/46490 A1 | 6/2001 |
| WO | WO-02/45871 A1 | 6/2002 |
| WO | WO-02/48427 A1 | 6/2002 |
| WO | WO-02/073329 A2 | 9/2002 |
| WO | WO-02/073660 A2 | 9/2002 |
| WO | WO-02/081771 A2 | 10/2002 |
| WO | WO-02/095807 A2 | 11/2002 |
| WO | WO-03/008662 A2 | 1/2003 |
| WO | WO-03/016587 A1 | 2/2003 |
| WO | WO-03/028069 A2 | 4/2003 |
| WO | WO-03/033762 A1 | 4/2003 |
| WO | WO-03/035927 A2 | 5/2003 |
| WO | WO-03/052807 A1 | 6/2003 |

OTHER PUBLICATIONS

U.S. Appl. No. 11/027,825, filed Dec. 29, 2004, Derderian et al.
U.S. Appl. No. 10/933,604, filed Sep. 2, 2004, Carpenter et al.
U.S. Appl. No. 10/683,424, filed Oct. 10, 2003, Mardian.
U.S. Appl. No. 10/839,316, filed May 5, 2004, Saragiannis et al.
U.S. Appl. No. 10/814,573, filed Mar. 31, 2004, Gealy et al.
U.S. Appl. No. 11/043,629, filed Jan. 25, 2005, Rueger et al.
U.S. Appl. No. 11/018,142, filed Dec. 20, 2004, Rueger et al.
U.S. Appl. No. 10/840,571, filed May 6, 2004, Dando et al.
U.S. Appl. No. 10/859,883, filed Jun. 2, 2004, Miller et al.
U.S. Appl. No. 10/683,606, filed Oct. 9, 2003, Derderian.
U.S. Appl. No. 11/027,809, filed Dec. 29, 2004, Carpenter et al.
U.S. Appl. No. 09/651,037, filed Aug. 30, 2000, Mardian.
U.S. Appl. No. 10/365,085, filed Feb. 11, 2003, Carpenter et al.
U.S. Appl. No. 10/733,523, filed Dec. 10, 2003, Beaman et al.
Integrated Process Systems Ltd., "ALD & CVD", 2 pages, retrieved from the Internet on Dec. 11, 2001, <http://www.ips-tech.com/eng/pro-p2-2.htm>.
Deublin Company, "Rotating Unions", 1 page, retrieved from the Internet on Feb. 4, 2002, <http://www.com/products/rotatingunions.htm>.
Cameron, I., "Atomic Layer Deposition Chamber Works at Low Temperatures", 2 pages, Electronic Times, Jul. 19, 2001, <http://www.electronictimes.com/story/OEG20010719S0042>.
Cutting Edge Optronics, 600W QCW Laser Diode Array, Part No. ARR48P600, 2 pages, Oct. 2001, <www.ceolaser.com>.
Henning, A.K., et al., "Microfluidic MEMS for Semiconductor Processing," IEEE Trans. Components, Packaging, and Manufacturing Technology B21, pp. 329-337, 1998.
Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).
Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.
Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).
Maillefer, D., et al., "A High-Performance Silicon Micropump for Disposable Drug Delivery Systems," pp. 413-417, IEEE, 2001.
Henning, A.K., et al., "A thermopneumatically actuated microvalve for liquid expansion and proportional control", Proceedings, Transducers '97:1997 International Solid State Sensors and Actuators Conference, pp. 825-828.
University of California, Berkeley, University Extension, "Atomic Layer Deposition," 5 pages, Sep. 24-25, 2001, <http://www.unex.berkeley.edu/eng/br225/1-1.html>.
Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.
Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.
Ready, J.F., "Effects Due to Absorption of Laser Radiation," Journal of Applied Physics, vol. 36, No. 2, pp. 462-468, Feb. 1965, Journal of Applied Physics, American Institute of Physics.
Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.
Tokyo Electron Limited, Plasma Process System, Trias SPA, 1 page, retrieved from the Internet on Oct. 16, 2004, <http://www.tel.com/eng/products/spe/sdtriasspa.htm>.
Olsson, A., "Valve-less Diffuser Micropumps", ISSN 0281-2878, 66 pages, 1998.
Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.
Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.
Henning, A.K. et al., "Contamination Reduction Using MEMS-BASED, High-Precision Mass Flow Controllers," Proceedings, SEMICON West Symposium on Contamination Free Manufacturing for Semiconductor Processing (SEMI, Mountain View, CA, 1998), pp. 1-11.
Henning, A.K., "Microfluidic MEMS," Proceedings, IEEE Aerospace Conference, Paper 4.906 (IEEE Press, Piscataway, NJ, 1998), 16 pages.
Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.
The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.
Deublin Company, "Sealing," 2 pages, retrieved from the Internet on Feb. 4, 2002, <http://www.deublin.com/products/sealing.htm>.
Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.
Integrated Process Systems Ltd., "Nano-ALD", 2 pages, retrieved from the Internet on Dec. 11, 2001, <http://www.ips-tech.com/eng/pro-p2.htm>.
Integrated Process Systems Ltd., "Welcome to IPS Ltd.", 1 page, retrieved from the Internet on Dec. 11, 2001, <http://www.ips-tech.com/eng/main.htm>.
Takahashi, K et al., "Process Integration of 3D Chip Stack with Vertical Interconnection," pp. 601-609, 2004 Electronic Components and Technology Conference, IEEE, Jun. 2004.

* cited by examiner

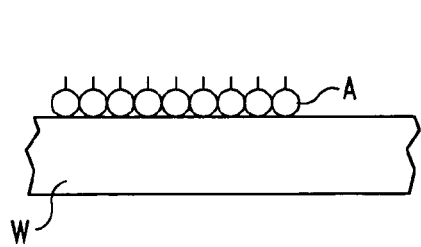
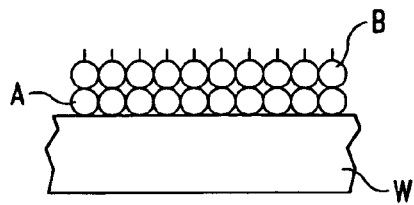
Fig. 1A
*(Prior Art)*
Fig. 1B
*(Prior Art)*
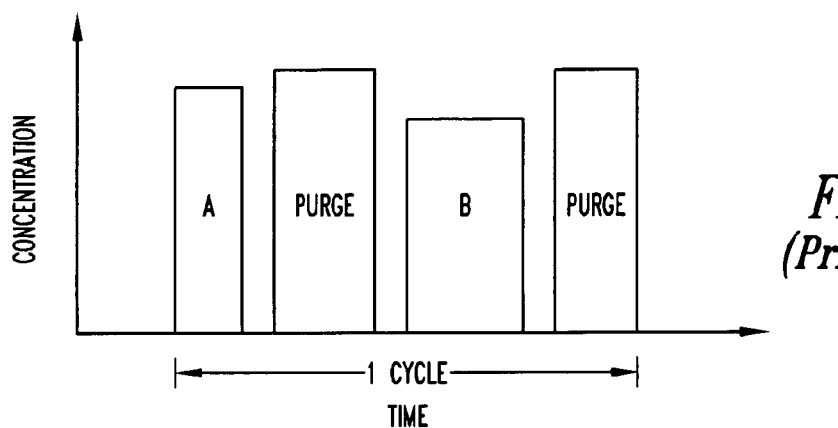
Fig. 2
*(Prior Art)*
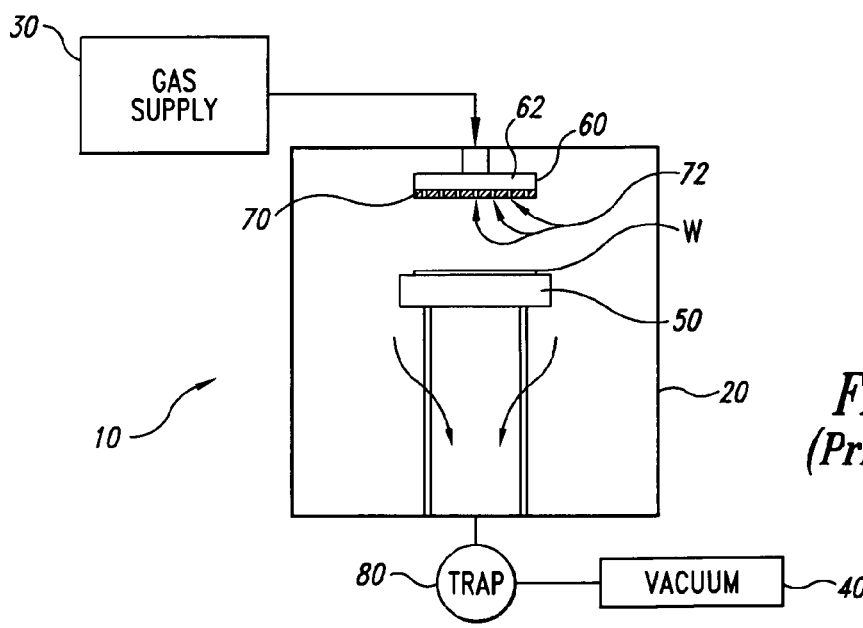
Fig. 3
*(Prior Art)*

SYSTEMS FOR DEPOSITING MATERIAL ONTO WORKPIECES IN REACTION CHAMBERS AND METHODS FOR REMOVING BYPRODUCTS FROM REACTION CHAMBERS

TECHNICAL FIELD

The present invention is related to systems for depositing material onto workpieces in reaction chambers and methods for removing byproducts from reaction chambers.

BACKGROUND

Thin film deposition techniques are widely used in the manufacturing of microfeatures to form a coating on a workpiece that closely conforms to the surface topography. The size of the individual components in the workpiece is constantly decreasing, and the number of layers in the workpiece is increasing. As a result, both the density of components and the aspect ratios of depressions (i.e., the ratio of the depth to the size of the opening) are increasing. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed while in a gaseous or vaporous state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. Referring to FIG. 1B, the layer of A molecules is then exposed to another precursor gas containing B molecules. The A molecules react with the B molecules to form an extremely thin layer of solid material on the workpiece W. The chamber is then purged again with a purge gas to remove excess B molecules.

FIG. 2 illustrates the stages of one cycle for forming a thin solid layer using ALD techniques. A typical cycle includes (a) exposing the workpiece to the first precursor A, (b) purging excess A molecules, (c) exposing the workpiece to the second precursor B, and then (d) purging excess B molecules. In actual processing, several cycles are repeated to build a thin film on a workpiece having the desired thickness. For example, each cycle may form a layer having a thickness of approximately 0.5-1.0 Å, and thus several cycles are required to form a solid layer having a thickness of approximately 60 Å.

FIG. 3 schematically illustrates a single-wafer ALD reactor 10 having a reaction chamber 20 coupled to a gas supply 30 and a vacuum 40. The reactor 10 also includes a heater 50 that supports the workpiece W and a gas dispenser 60 in the reaction chamber 20. The gas dispenser 60 includes a plenum 62 operably coupled to the gas supply 30 and a distributor plate 70 having a plurality of holes 72. In operation, the heater 50 heats the workpiece W to a desired temperature, and the gas supply 30 selectively injects the first precursor A, the purge gas, and the second precursor B, as shown above in FIG. 2. The vacuum 40 maintains a negative pressure in the reaction chamber 20 to draw the gases from the gas dispenser 60 across the workpiece W and then through an outlet of the reaction chamber 20. A trap 80 captures and collects the byproducts from the reaction chamber 20 to prevent fouling of the vacuum 40.

One drawback of ALD processing is that it has a relatively low throughput compared to CVD techniques. For example, each A-purge-B-purge cycle can take several seconds. This results in a total process time of several minutes to form a single thin layer of only 60 Å. In contrast to ALD processing, CVD techniques require only about one minute to form a 60 Å thick layer. The low throughput limits the utility of the ALD technology in its current state because ALD may create a bottleneck in the overall manufacturing process.

Another drawback of both ALD and CVD processing is the downtime required to service or replace the trap. As the trap collects byproducts from the reaction chamber, the byproducts restrict the flow from the reaction chamber 20 to the vacuum 40, and consequently, the pressure in the chamber increases. The increased pressure in the reaction chamber impairs effective removal of the byproducts from the reaction chamber. Accordingly, the trap is cleaned or replaced periodically to avoid significant increases in the pressure in the reaction chamber. Servicing the trap requires that the reactor be shut down, which results in a reduction in throughput. One approach to reduce the downtime of the reactor includes increasing the size of the trap. Although this approach reduces the downtime, a significant need still exists to eliminate the downtime required to service the trap and to maintain a consistent pressure in the reaction chamber.

BRIEF DESCRIPTION OF THE DRAWINGS

FIGS. 1A and 1B are schematic cross-sectional views of stages in ALD processing in accordance with the prior art.

FIG. 2 is a graph illustrating a cycle for forming a layer using ALD techniques in accordance with the prior art.

FIG. 3 is a schematic representation of a system including a reactor for depositing material onto a microfeature workpiece in accordance with the prior art.

DETAILED DESCRIPTION

A. Overview

Figure 4:
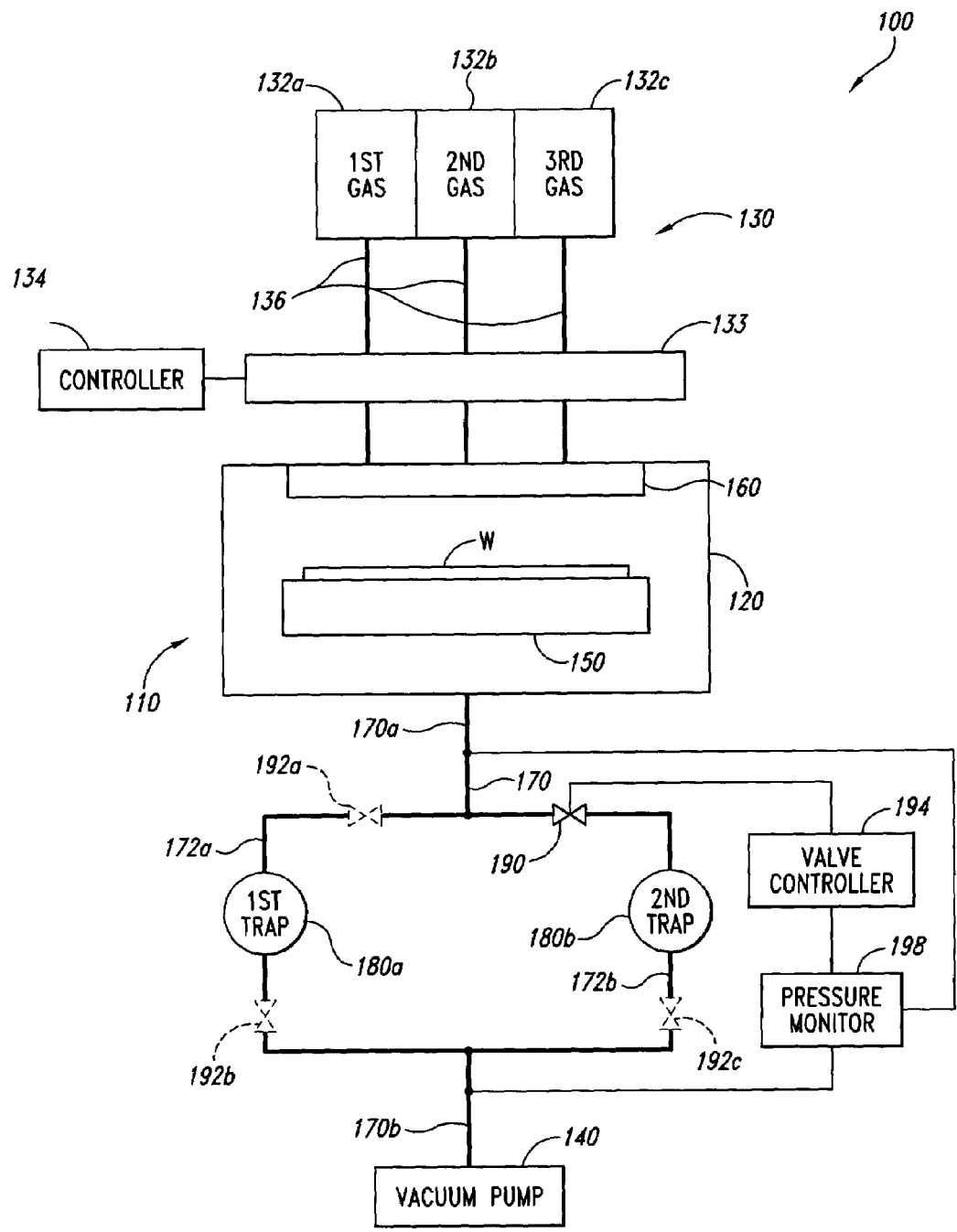
FIG. 4 is a schematic representation of a system for depositing material onto a microfeature workpiece in accordance with one embodiment of the invention.

The following disclosure describes several embodiments of systems for depositing material onto workpieces in reaction chambers and methods for removing byproducts from reaction chambers. Many specific details of the invention are described below with reference to single-wafer reactors for depositing material onto microfeature workpieces, but several embodiments can be used in batch systems for processing a plurality of workpieces simultaneously. Moreover, several embodiments can be used for depositing material onto workpieces other than microfeature workpieces. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4-6 and the following text to provide a thorough understanding of particular embodiments of the invention. A person skilled in the art will understand, however, that the invention may have additional embodiments, or that the invention may be practiced without several of the details of the embodiments shown in FIGS. 4-6.

One aspect of the invention is directed to systems for depositing material onto workpieces in reaction chambers. In one embodiment, a system includes a gas phase reaction chamber, a first exhaust line coupled to the reaction chamber, first and second traps each in fluid communication with the first exhaust line, and a vacuum pump coupled to the first exhaust line to remove gases from the reaction chamber. The first and second traps are operable independently to individually and/or jointly collect byproducts from the reaction chamber. In one aspect of this embodiment, the first exhaust line includes a first branchline and a second branchline each downstream from the reaction chamber. The first trap can be disposed in the first branchline and the second trap can be disposed in the second branchline. The first and second branchlines can be configured in a parallel arrangement. In another aspect of this embodiment, the system further includes a throttling valve in the second branchline, a pressure monitor, and a controller operably coupled to the throttling valve and the pressure monitor. The pressure monitor can determine the difference between the pressure in the first exhaust line upstream from the first trap and the pressure in the first exhaust line downstream from the first trap. The controller can operate the throttling valve to control the flow of byproducts into the second branchline to maintain the pressure differential in the first exhaust line within a desired range.

In another embodiment, a system includes a gas phase reaction chamber, a first exhaust line coupled to the reaction chamber, a trap in the first exhaust line to collect byproducts from the reaction chamber, and first and second vacuum pumps. The first and second vacuum pumps are each in fluid communication with the first exhaust line and positioned downstream from the trap. The first and second vacuum pumps are operable independently to individually and/or jointly exhaust byproducts from the reaction chamber. In one aspect of this embodiment, the first exhaust line includes a first branchline and a second branchline each downstream from the reaction chamber. The first vacuum pump can be coupled to the first branchline and the second vacuum pump can be coupled to the second branchline. The system can also include a throttling valve in the second branchline to control the pressure in the first exhaust line.

Another aspect of the invention is directed to methods for removing byproducts from a reaction chamber through a first mainline. The first mainline has first and second branchlines downstream from the reaction chamber. In one embodiment, the method includes exhausting byproducts from the reaction chamber through the first mainline and dynamically controlling the flow of byproducts into the second branchline of the first mainline to maintain a pressure differential in the first mainline within a desired range. In one aspect of this embodiment, the method further includes collecting byproducts in a first trap in the first branchline of the first mainline and collecting byproducts in a second trap in the second branchline of the first mainline. In another aspect of this embodiment, the method further includes monitoring the difference between the pressure in the first mainline upstream from the first trap and the pressure in the first mainline downstream from the first trap. In response to the monitored pressure differential, a throttling valve in the second branchline can be regulated to maintain the pressure differential within the desired range.

B. Deposition Systems

FIG. 4 is a schematic representation of a system 100 for depositing material onto a microfeature workpiece W in accordance with one embodiment of the invention. In this embodiment, the system 100 includes a reactor 110 having a reaction chamber 120 coupled to a gas supply 130 and a vacuum pump 140. The reactor 110 also includes a gas distributor 160 coupled to the reaction chamber 120 and the gas supply 130 to dispense gas(es) into the reaction chamber 120 and onto the workpiece W. Byproducts including excess and/or unreacted gas molecules are removed from the reaction chamber 120 by the vacuum pump 140 and injecting a purge gas into the chamber 120.

The gas supply 130 includes a plurality of gas sources 132 (identified individually as 132a-c) and a plurality of gas lines 136 coupled to the gas sources 132. The gas sources 132 can include a first gas source 132a for providing a first gas, a second gas source 132b for providing a second gas, and a third gas source 132c for providing a third gas. The first and second gases can be first and second precursors, respectively. The third gas can be a purge gas. The first and second precursors are the gas and/or vapor phase constituents that react to form the thin, solid layer on the workpiece W. The purge gas can be a suitable type of gas that is compatible with the reaction chamber 120 and the workpiece W. In other embodiments, the gas supply 130 can include a different number of gas sources 132 for applications that require additional precursors or purge gases. In additional embodiments, the gas sources 132 can include one or more etchants for deposition onto a microfeature workpiece during etching.

The system 100 of the illustrated embodiment further includes a valve assembly 133 coupled to the gas lines 136 and a controller 134 operably coupled to the valve assembly 133. The controller 134 generates signals to operate the valve assembly 133 to control the flow of gases into the reaction chamber 120 for ALD and CVD applications. For example, the controller 134 can be programmed to operate the valve assembly 133 to pulse the gases individually through the gas distributor 160 in ALD applications or to mix selected precursors in the gas distributor 160 in CVD applications. More specifically, in one embodiment of an ALD process, the controller 134 directs the valve assembly 133 to dispense a pulse of the first gas (e.g., the first precursor) into the reaction chamber 120. Next, the controller 134 directs the valve assembly 133 to dispense a pulse of the third gas (e.g., the purge gas) to purge excess molecules of the first gas from the reaction chamber 120. The controller 134 then directs the valve assembly 133 to dispense a pulse of the second gas (e.g., the second precursor), followed by a pulse of the third gas. In one embodiment of a pulsed CVD process, the controller 134 directs the valve assembly 133 to dispense a pulse of the first and second gases (e.g., the first and second precursors) into the reaction chamber 120. Next, the controller 134 directs the valve assembly 133 to dispense a pulse of the third gas (e.g., the purge gas) into the reaction chamber 120. In other embodiments, the controller 134 can dispense the gases in other sequences.

In the illustrated embodiment, the reactor 110 also includes a workpiece support 150 to hold the workpiece W in the reaction chamber 120. In one aspect of this embodiment, the workpiece support 150 can be heated to bring the workpiece W to a desired temperature for catalyzing the reaction between the first gas and the second gas at the surface of the workpiece W. For example, the workpiece support 150 can be a plate with a heating element. The workpiece support 150, however, may not be heated in other applications.

The system 100 further includes an exhaust mainline 170 coupled to the vacuum pump 140 and the reaction chamber 120 to remove byproducts, including excess and/or unreacted gas molecules, from the reaction chamber 120. The mainline 170 includes an upstream portion 170a, a downstream portion 170b, a first branchline 172a, and a second branchline 172b. The branchlines 172a-b can be configured in a parallel arrangement and coupled to the upstream and downstream portions 170a-b. Accordingly, discrete byproducts flow through either the first branchline 172a or the second branchline 172b. In this embodiment, the system 100 further includes a first trap 180a disposed in the first branchline 172a and a second trap 180b disposed in the second branchline 172b. The traps 180a-b capture and collect byproducts in the branchlines 172a-b to prevent damage to the vacuum pump 140. In other embodiments, the system can include a different number of branchlines and/or traps.

In one aspect of this embodiment, the system 100 further includes a throttling valve 190 in the second branchline 172b, a valve controller 194 operably coupled to the throttling valve 190, and a pressure monitor 198 operably coupled to the valve controller 194. The throttling valve 190 and the valve controller 194 regulate the flow of byproducts into the second branchline 172b, and the pressure monitor 198 determines the pressure difference between the upstream and downstream portions 170a-b of the mainline 170. The throttling valve 190, the valve controller 194, and the pressure monitor 198 can operate together to maintain the pressure in the upstream portion 170a of the mainline 170 within a desired range. For example, the pressure differential across the first trap 180a increases as the first trap 180a collects byproducts because the byproducts in the first trap 180a obstruct the flow from the reaction chamber 120 to the vacuum pump 140. The pressure monitor 198 detects this increase in the pressure differential across the first trap 180a and sends a signal to the valve controller 194. In response to the signal, the valve controller 194 at least partially opens the throttling valve 190 to allow some of the flow of byproducts to pass through the second branchline 172b. The throttling valve 190 is opened sufficiently to reduce the pressure differential in the upstream and downstream portions 170a-b of the mainline 170 to within the desired range. In additional embodiments, the system 100 can include a throttling valve in the first branchline 172a that is coupled to the valve controller 194.

One feature of this embodiment of the system 100 is that it maintains the pressure differential between the upstream and downstream portions 170a-b of the mainline 170 as the traps 180a-b collect byproducts. Accordingly, the pressure in the upstream portion 170a and the reaction chamber 120 can remain generally consistent. An advantage of this feature is that a consistent pressure in the reaction chamber 120 helps create a consistent flow through the reaction chamber 120. More specifically, a consistent pressure facilitates the consistent, effective removal of byproducts, including excess and/or unreacted gas molecules, from the reaction chamber 120. In contrast, the pressure in many prior art reaction chambers increases as the trap collects byproducts that obstruct the exhaust line. This increase in pressure (i.e., decrease in negative pressure) in the prior art reaction chambers impairs consistent, effective removal of the byproducts from the reaction chambers, and consequently, the byproducts may react with incoming gases.

In another aspect of the illustrated embodiment, the system 100 can include a plurality of valves 192 (identified individually as 192a-c) to selectively isolate the first and/or second traps 180a-b for service or replacement. The first branchline 172a, for example, can include a first valve 192a (shown in hidden lines) upstream from the first trap 180a and a second valve 192b (shown in hidden lines) downstream from the first trap 180a. The first and second valves 192a-b can be closed to allow the first trap 180a to be serviced or replaced without interrupting the deposition process of the system 100. For example, when the first and second valves 192a-b are closed, the throttle valve 190 can be opened enough to exhaust the byproducts solely through the second branchline 172b of the mainline 170. The first trap 180a can then be replaced with a new trap without shutting down the system 100. Similarly, the second branchline 172b can include a third valve 192c (shown in hidden lines) downstream from the second trap 180b. The throttling valve 190 and the third valve 192c can be closed to allow the second trap 180b to be serviced or replaced without interrupting the deposition process of the system 100. In other embodiments, the system 100 may not include the valves 192.

One feature of the illustrated embodiment is that the system 100 does not need to be shut down to replace and/or service the traps 180. Each trap 180 can be isolated for service or replacement, and while one trap 180 is serviced, the other trap 180 can collect byproducts. An advantage of this feature is that the throughput of the system 100 is increased because the downtime resulting from servicing the traps 180 is reduced or eliminated.

C. Other Systems to Remove Byproducts

Figure 5:
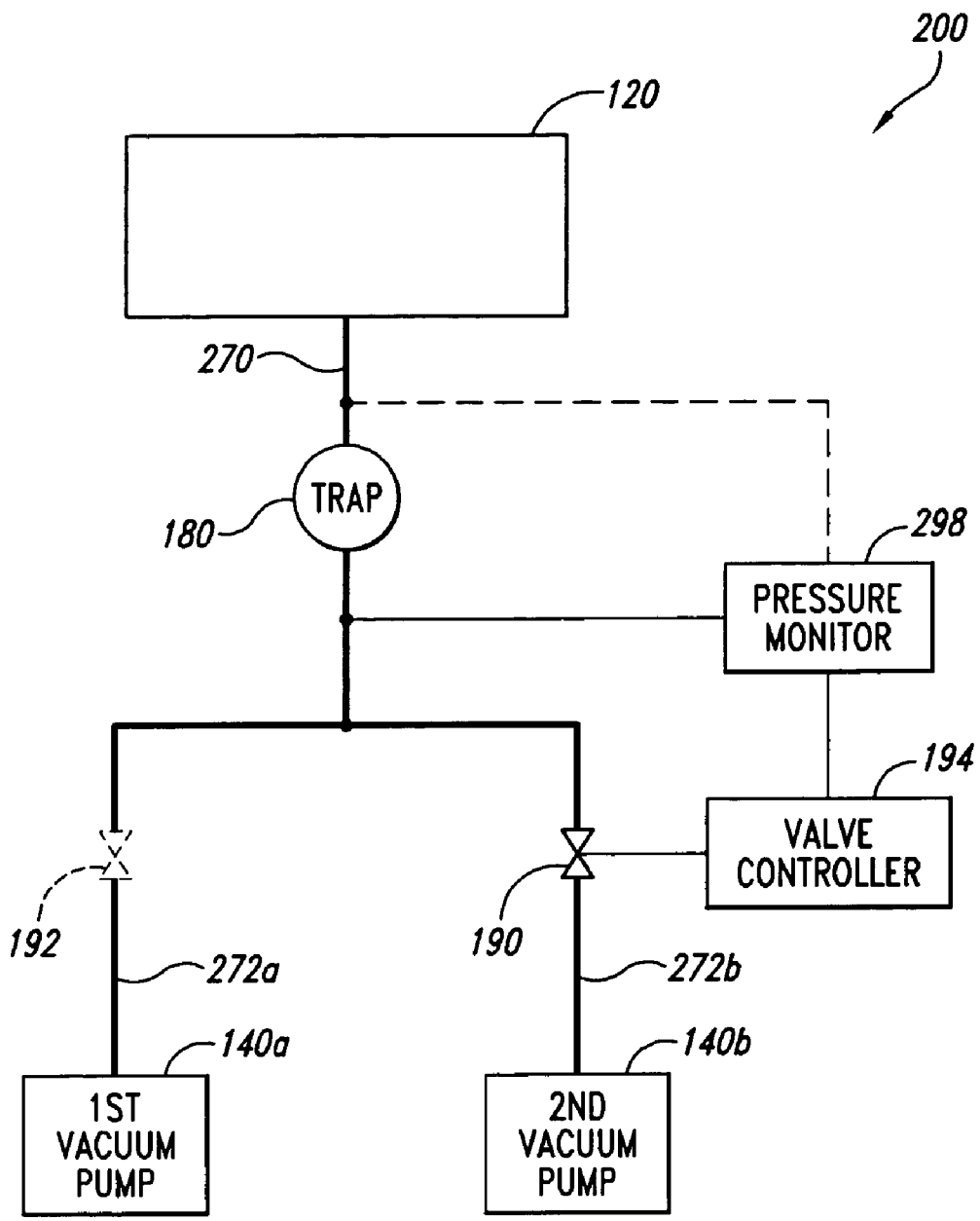
FIG. 5 is a schematic representation of a portion of a system for depositing material onto a workpiece in accordance with another embodiment of the invention.

FIG. 5 is a schematic representation of a portion of a system 200 for depositing material onto a workpiece in accordance with another embodiment of the invention. The system 200 can be generally similar to the system 100 described above with reference to FIG. 4. For example, the system 200 includes a reaction chamber 120, a mainline 270 coupled to the reaction chamber 120, and a trap 180 in the mainline 270 to capture and collect the byproducts from the reaction chamber 120. The mainline 270 includes a first branchline 272a and a second branchline 272b each downstream from the trap 180. The system 200 further includes a first vacuum pump 140a coupled to the first branchline 272a and a second vacuum pump 140b coupled to the second branchline 272b.

In one aspect of this embodiment, the system 200 includes a throttling valve 190 in the second branchline 272b, a valve controller 194 operably coupled to the throttling valve 190, and a pressure monitor 298 operably coupled to the valve controller 194 to determine the pressure in the mainline 270 downstream from the trap 180. The throttling valve 190, the valve controller 194, and the pressure monitor 298 can operate together to maintain a consistent pressure in the mainline 270 and/or maintain a consistent mass flow rate and/or fluid velocity of byproducts through the mainline 270. For example, in one embodiment, if the first vacuum pump 140a is fouled because the trap 180 fails to capture all the byproducts in the mainline 270, the pressure in the mainline 270 will increase and the throughput of byproducts through the mainline 270 will decrease. The pressure monitor 298 detects the pressure increase and sends a signal to the valve controller 194. In response to the signal, the valve controller 194 opens the throttling valve 190 sufficiently to allow the second vacuum pump 140b to reduce the pressure in the mainline 270 to a desired range and to increase the throughput of byproducts in the mainline 270 to a consistent level. In other embodiments, the pressure monitor 298 can monitor the pressure differential in the mainline 270 upstream and downstream of the trap 180 (shown in broken line). In this embodiment, if the trap 180 is fouled, the pressure upstream from the trap 180 will increase. The valve controller 194 can accordingly open the valve 190 to reduce the pressure downstream from the trap 180 and thus increase the flow rate across the trap 180. The system 200 can include a different number of branchlines and vacuum pumps than shown in FIG. 5, or the system 200 can include a throttling valve in the first branchline 272a in still another embodiment.

In one aspect of this embodiment, the first branchline 272a can include a valve 192 (shown in hidden lines) to control the flow through the first branchline 272a. The valve 192 allows the first vacuum pump 140a to be serviced or replaced without interrupting the deposition process of the system 200. For example, when the valve 192 is closed to service or replace the first vacuum pump 140a, the second vacuum pump 140b can continue to remove byproducts from the reaction chamber 120.

One feature of the embodiment illustrated in FIG. 5 is that the system 200 does not need to be shut down to replace and/or service one of the vacuum pumps 140 because the valves 190 and 192 can isolate the vacuum pump 140. An advantage of this feature is that the throughput of the system 200 is increased because the downtime for servicing the vacuum pumps 140 is reduced or eliminated. Another feature of this embodiment is that a consistent pressure can be maintained in the mainline 270, and consequently, byproducts can be removed from the reaction chamber 120 at a consistent rate. An advantage of this feature is that removing byproducts from the reaction chamber 120 at a consistent rate results in a more consistent deposition process and reduces the likelihood that byproducts may recirculate in the reaction chamber 120 and react with incoming gases.

Figure 6:
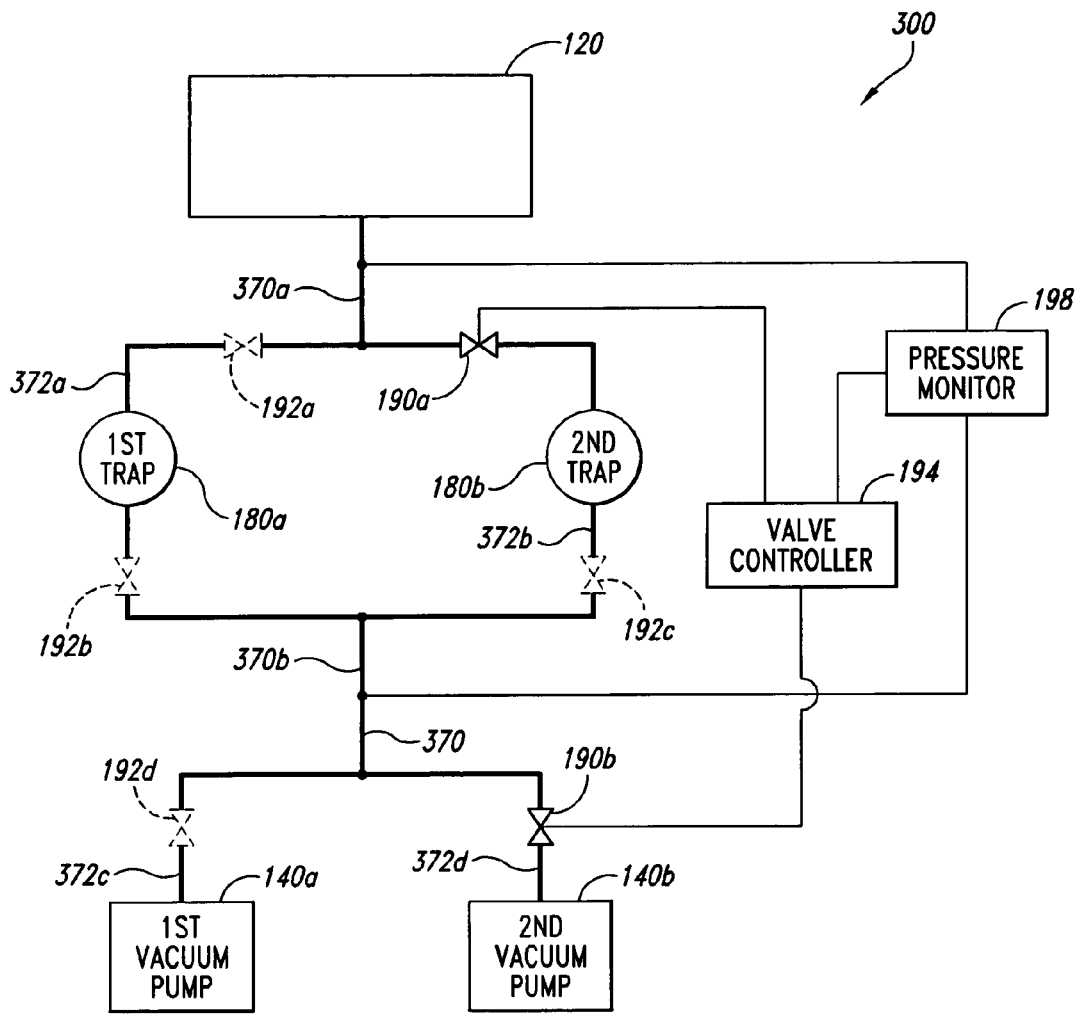
FIG. 6 is a schematic representation of a portion of a system for depositing material onto a workpiece in accordance with another embodiment of the invention.

FIG. 6 is a schematic representation of a portion of a system 300 for depositing material onto a workpiece in accordance with another embodiment of the invention. The system 300 can be generally similar to the systems 100 and 200 described above with reference to FIGS. 4 and 5. For example, the system 300 includes a reaction chamber 120, a mainline 370 coupled to the reaction chamber 120, a plurality of traps 180 (identified individually as 180a-b) in the mainline 370, and a plurality of vacuum pumps 140 (identified individually as 140a-b) coupled to the mainline 370. The mainline 370 includes first and second branchlines 372a-b configured in a parallel arrangement and third and fourth branchlines 372c-d configured in a parallel arrangement downstream from the first and second branchlines 372a-b. In the illustrated embodiment, a first trap 180a is disposed in the first branchline 372a, a second trap 180b is disposed in the second branchline 372b, a first vacuum pump 140a is coupled to the third branchline 372c, and a second vacuum pump 140b is coupled to the fourth branchline 372d.

The system 300 of the illustrated embodiment can further include a first throttling valve 190a in the second branchline 372b, a second throttling valve 190b in the fourth branchline 372d, a valve controller 194 operably coupled to the throttling valves 190a-b, and a pressure monitor 198 coupled to the valve controller 194. The pressure monitor 198 monitors the pressure difference between an upstream portion 370a of the mainline 370 and a downstream portion 370b of the mainline 370. As described above with reference to FIG. 4, the valve controller 194 can regulate the first throttling valve 190a to create a desired pressure differential in the upstream and downstream portions 370a-b of the mainline 370. Moreover, as described above with reference to FIG. 5, the valve controller 194 can regulate the second throttling valve 190b to create a consistent pressure in the mainline 370 if the first vacuum pump 140a is fouled. The system 300 can further include a plurality of valves 192 (identified individually as 192a-d) to isolate the traps 180a-b and/or vacuum pumps 140a-b so that the traps 180a-b and vacuum pumps 140a-b can be serviced or replaced without interrupting the deposition process in the system 300, as described above with reference to FIGS. 4 and 5. In other embodiments, the system can include additional traps, vacuums, and/or branchlines.

From the foregoing, it will be appreciated that specific embodiments of the invention have been described herein for purposes of illustration but that various modifications may be made without deviating from the spirit and scope of the invention. Accordingly, the invention is not limited, except as by the appended claims.

We claim:

1. A system for depositing material onto a workpiece in a reaction chamber, the system comprising:
   a reaction chamber;
   a mainline coupled to the reaction chamber, the mainline having a first branchline and a second branchline each downstream from the reaction chamber;
   a first trap in the first branchline to collect byproducts from the reaction chamber;
   a second trap in the second branchline to collect byproducts from the reaction chamber;
   a throttling valve in the second branchline;
   a pressure monitor to determine a pressure difference between a pressure in the mainline upstream from the first trap and a pressure in the mainline downstream from the first trap;
   a vacuum pump coupled to the mainline; and
   a controller operably coupled to the pressure monitor and the throttling valve, the controller having a computer-readable medium containing instructions that cause the controller to perform a method comprising—
      exhausting byproducts from the reaction chamber through the first trap in the first branchline;

determining the pressure difference across the first trap caused by a flow of the byproducts by monitoring the pressure monitor;

dynamically controlling the flow of byproducts into the second trap in the second branchline by regulating the throttling valve; and maintaining the pressure differential across the first trap in the mainline based on the determined pressure difference.

2. The system of claim 1 wherein the first branchline and the second branchline are configured in a parallel arrangement.

3. The system of claim 1 wherein:

the mainline further includes a third branchline and a fourth branchline each downstream from the first and second branchlines;

the vacuum pump comprises a first vacuum pump coupled to the third branchline; and the system further comprises a second vacuum pump coupled to the fourth branchline.

4. The system of claim 1 wherein the throttling valve comprises a first valve, and wherein the system further comprises a second valve in the first branchline upstream of the first trap and a third valve in the first branchline downstream of the first trap.

5. A system for depositing material onto a workpiece in a reaction chamber, the system comprising:

a reaction chamber;

a mainline coupled to the reaction chamber, the mainline having a first branchline and a second branchline each downstream from the reaction chamber;

a first trap in the first branchline to collect byproducts from the reaction chamber;

a second trap in the second branchline to collect byproducts from the reaction chamber;

a throttling valve in the second branchline;

a pressure monitor to determine a pressure difference between a pressure in the mainline upstream from the first trap and a pressure in the mainline downstream from the first trap;

a vacuum pump coupled to the mainline; and a controller operably coupled to the pressure monitor and the throttling valve, the controller having a computer-readable medium containing instructions that cause the controller to perform a method comprising— exhausting byproducts from the reaction chamber through the first branchline;

collecting byproducts in the first trap in the first branchline;

monitoring the difference between the pressure in the mainline upstream of the first trap and the pressure in the mainline downstream of the first trap;

regulating the throttling valve in the second branchline in response to the monitored pressure differential in the mainline to flow byproducts into the second branchline; and maintaining the pressure differential in the mainline within a desired range by regulating the throttling valve.

6. The system of claim 5 wherein the first branchline and the second branchline are configured in a parallel arrangement.

7. The system of claim 5 wherein:

the mainline further includes a third branchline and a fourth branchline each downstream from the first and second branchlines;

the vacuum pump comprises a first vacuum pump coupled to the third branchline; and the system further comprises a second vacuum pump coupled to the fourth branchline.

8. The system of claim 5 wherein the throttling valve comprises a first valve, and wherein the system further comprises a second valve in the first branchline upstream of the first trap and a third valve in the first branchline downstream of the first trap.

* * * * *